United States Patent
Shishido et al.

(10) Patent No.: US 9,625,807 B2
(45) Date of Patent: Apr. 18, 2017

(54) MASK BLANK, TRANSFER MASK, METHOD OF MANUFACTURING A MASK BLANK, METHOD OF MANUFACTURING A TRANSFER MASK AND METHOD OF MANUFACTURING A SEMICONDUCTOR DEVICE

(71) Applicant: HOYA CORPORATION, Tokyo (JP)

(72) Inventors: Hiroaki Shishido, Tokyo (JP); Atsushi Kominato, Tokyo (JP); Osamu Nozawa, Tokyo (JP); Toshiharu Kikuchi, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 155 days.

(21) Appl. No.: 14/443,689

(22) PCT Filed: Nov. 15, 2013

(86) PCT No.: PCT/JP2013/080874
§ 371 (c)(1),
(2) Date: May 19, 2015

(87) PCT Pub. No.: WO2014/080840
PCT Pub. Date: May 30, 2014

(65) Prior Publication Data
US 2015/0293441 A1    Oct. 15, 2015

(30) Foreign Application Priority Data

Nov. 20, 2012 (JP) ................................. 2012-254157

(51) Int. Cl.
| | | |
|---|---|---|
| *G03F 1/50* | (2012.01) | |
| *G03F 1/60* | (2012.01) | |
| *G03F 7/20* | (2006.01) | |
| *C03C 3/06* | (2006.01) | |
| *C03C 17/34* | (2006.01) | |

(52) U.S. Cl.
CPC ............. *G03F 1/50* (2013.01); *C03C 3/06* (2013.01); *C03C 17/3435* (2013.01); *G03F 1/60* (2013.01); *C03C 2218/32* (2013.01); *C03C 2218/328* (2013.01); *C03C 2218/34* (2013.01)

(58) Field of Classification Search
CPC .... G03F 1/50; G03F 1/60; G03C 3/06; G03C 17/3435
USPC ............................................. 430/5, 311, 945
See application file for complete search history.

(56) References Cited

U.S. PATENT DOCUMENTS

| | | |
|---|---|---|
| 2007/0066477 A1 | 3/2007 | Harper et al. |
| 2008/0063950 A1 | 3/2008 | Yoshikawa et al. |
| 2008/0119346 A1 | 5/2008 | Otsuka et al. |
| 2009/0226826 A1 | 9/2009 | Nozawa |
| 2013/0177841 A1 | 7/2013 | Sakai et al. |

FOREIGN PATENT DOCUMENTS

| | | |
|---|---|---|
| JP | 9-124337 A | 5/1997 |
| JP | 11-292551 A | 10/1999 |
| JP | 2004-26587 A | 1/2004 |
| JP | 2006-78807 A | 3/2006 |
| JP | 2007-84427 A | 4/2007 |
| JP | 2008-63181 A | 3/2008 |
| JP | 2009-230112 A | 10/2009 |
| JP | 2010-192503 A | 9/2010 |
| WO | 2012/043695 A1 | 4/2012 |

OTHER PUBLICATIONS

International Search Report for PCT/JP2013/080874 dated Feb. 10, 2014.

*Primary Examiner* — Christopher Young
(74) *Attorney, Agent, or Firm* — Sughrue Mion, PLLC

(57) ABSTRACT

Provided are a mask blank for which worsening of flatness has been inhibited, a transfer mask, a method of manufacturing a mask blank, a method of manufacturing a transfer mask, and a method of manufacturing a semiconductor device using this transfer mask. The mask blank is a mask blank provided with a thin film on a main surface of a glass substrate, wherein the glass substrate has a hydrogen content of less than $7.4 \times 10^{18}$ molecules/cm$^3$, the thin film is made of a material containing tantalum and being substantially free of hydrogen, and the thin film is formed in contact with the main surface of the glass substrate.

20 Claims, 3 Drawing Sheets

MASK BLANK, TRANSFER MASK, METHOD OF MANUFACTURING A MASK BLANK, METHOD OF MANUFACTURING A TRANSFER MASK AND METHOD OF MANUFACTURING A SEMICONDUCTOR DEVICE

CROSS REFERENCE TO RELATED APPLICATIONS

This application is a National Stage of International Application No. PCT/JP2013/080874 filed Nov. 15, 2013, claiming priority based on Japanese Patent Application No. 2012-254157 filed Nov. 20, 2012, the contents of all of which are incorporated herein by reference in their entirety.

TECHNICAL FIELD

The present invention relates to a mask blank provided with a low stress film, a transfer mask, and methods of manufacturing the same. More particularly, the present invention relates to a mask blank in which changes over time in the stress of a thin film are reduced, a transfer mask and methods of manufacturing the same. In addition, the present invention relates to a method of manufacturing a semiconductor device that uses this transfer mask.

BACKGROUND ART

In general, the formation of a fine pattern in the manufacturing process of semiconductor devices is carried out using photolithography. In addition, multiple substrates referred to as transfer masks are normally used to form this fine pattern. This transfer mask is typically provided with a fine pattern composed of a metal thin film and the like on a transparent glass substrate, and photolithography is also used to manufacture this transfer mask.

A mask blank having a thin film (such as a light shielding film) for forming a transfer pattern (mask pattern) on a transparent substrate such as a glass substrate is used to manufacture a transfer mask by photolithography. The process used to manufacture a transfer mask using this mask blank includes an exposure step of drawing a desired pattern in a resist film formed on a mask blank, a development step of forming a resist pattern by developing the resist film in accordance with the desired pattern drawing, an etching step of etching the thin film in accordance with the resist pattern, and a step of stripping and removing the residual resist pattern. In the development step, a desired pattern is drawn (exposed) on a resist film formed on a mask blank. Next, a developing solution is supplied to the resist film to dissolve the site of the resist film that is soluble in the developing solution. As a result, a resist pattern is formed in the resist film. In the etching step, a site of the thin film where the resist pattern is not formed, namely a site where the thin film is exposed, is dissolved by dry etching or wet etching using this resist pattern as a mask. As a result, the desired mask pattern is formed on the transparent substrate. A transfer mask is obtained in this manner.

In miniaturizing the pattern of a semiconductor device, it is necessary to use a short wavelength for the wavelength of the exposure light source used in photolithography in addition to miniaturizing the pattern formed on the transfer mask. In recent years, increasingly shorter wavelengths are being used as indicated by the transition from KrF excimer lasers (wavelength: 248 nm) to ArF excimer lasers (wavelength: 193 nm) for use as the exposure light source during the manufacturing of semiconductor devices.

Binary masks having a light shielding pattern composed of a chromium-based material on a transparent substrate have conventionally been known to be used as transfer masks.

In recent years, binary masks for use with ArF excimer lasers have appeared that use a material containing a molybdenum silicide compound (MoSi-based material) for the light shielding film (Patent Literature 1). In addition, binary masks for use with ArF excimer lasers have also appeared that use a material containing a tantalum compound (tantalum-based material) for the light shielding film (Patent Literature 2). Patent Literature 3 describes that a light shielding film may be subjected to hydrogen embrittlement and deform in the case of cleaning a photomask composed of a light shielding film that uses a metal containing at least two of tantalum, niobium and vanadium by acid cleaning or with hydrogen plasma. It is also described that the solution thereof is to form a hydrogen blocking film that covers the upper surface and lateral surfaces of the light shielding film so as to be airtight after having formed a pattern in the light shielding film.

On the other hand, Patent Literature 4 describes a synthetic quartz glass substrate for use with an excimer laser and a method of manufacturing the same. Here, when the synthetic quartz glass is irradiated with excimer laser light, and particularly ArF excimer laser light, Si—O—Si bonds within the glass are cleaved by the high energy of the laser light, and as a result of the formation of paramagnetic defects referred to as E' centers (E prime centers), an absorption region ends up forming in the 215 nm wavelength band, and as a result thereof, this was indicated to lead to a decrease in transmittance with respect to ArF excimer laser light. In addition, it is disclosed that, as a result of the concentration of hydrogen molecules in the synthetic quartz glass reaching a certain level or higher, the occurrence of paramagnetic defects can be reduced.

PRIOR ART REFERENCES

Prior Art Literature

Patent Literature 1: JP 2006-78807A
Patent Literature 2: JP 2009-230112A
Patent Literature 3: JP 2010-192503A
Patent Literature 4: JP 2008-63181A

DISCLOSURE OF THE INVENTION

Problems to be Solved by the Invention

The required level of pattern positioning accuracy for transfer masks has become particularly severe in recent years. One way of realizing high pattern positioning accuracy is improving the flatness of mask blanks serving as the master for fabricating transfer masks. In order to improve the flatness of a mask blank, it is first necessary to improve the flatness of the main surface on the side of the glass substrate on which the thin film is formed. Glass substrates for manufacturing mask blanks are manufactured by manufacturing a glass ingot as described in Patent Literature 4 followed by cutting out into the shape of a glass substrate. Immediately after being cut out into the shape of a glass substrate, the flatness of the main surface of the glass substrate is poor and the surface is rough. Consequently, a plurality of stages of grinding and polishing are carried out on the glass substrate to finish to high flatness and preferable surface roughness (mirror surface). In addition, cleaning with a cleaning solution containing hydrofluoric acid solution or hydrofluorosilicic acid solution is carried out after a polishing step using abrasive grains. In addition, cleaning with a cleaning solution containing an alkaline solution may also be carried out prior to the step of forming the thin film.

However, this alone is insufficient for manufacturing a mask blank having high flatness. If the film stress of a thin film formed on a main surface of a glass substrate is high, the substrate ends up being deformed and flatness becomes poor. Consequently, various countermeasures are implemented either before or after film deposition in order to reduce film stress of the thin film for forming a pattern. It had previously been thought that mask blanks that incorporated such countermeasures and were adjusted so as to have high flatness would not undergo large changes in flatness even if stored for a somewhat long period of time (such as for about six months) after manufacturing provided they were stored in a sealed case. However, in the case of a mask blank in which a material containing tantalum is used in the thin film used for pattern formation, flatness of the main surface was confirmed to become worse as the amount of time from manufacturing progressed even if stored in a sealed case. More specifically, flatness of the main surface on the side on which a thin film is formed worsens in the direction in which the tendency to form a convex shape becomes stronger with the passage of time.

This means that, in cases in which the glass substrate is not the cause, film stress of a thin film gradually demonstrates an increasingly strong tendency towards compressive stress. This type of remarkable phenomenon does not occur in the case of a mask blank having a thin film that uses a material containing a chromium-based material or molybdenum silicide compound. On the basis thereof, this phenomenon, which occurs in mask blanks using a material containing tantalum for the thin film used for pattern formation, is presumed to not be caused by deformation of the glass substrate per se, but rather by an increase in compressive stress of the thin film over time. On the other hand, in the case of having fabricated a transfer mask using a mask blank of a thin film having such high compressive stress, there is the problem of the occurrence of a large positional shift in the pattern in the region of the thin film that has been released from film stress due to pattern formation. Moreover, even in the case of having fabricated a transfer mask in a short period of time after manufacturing the mask blank, there is the problem of the occurrence of a positional shift in the pattern as time passes following fabrication.

With the foregoing in view, an object of the present invention is to provide a manufacturing method of a mask blank, which inhibits worsening of flatness by eliminating the problem of film stress of a thin film demonstrating an increasingly strong tendency towards compressive stress over time, in a mask blank that uses a material containing tantalum in the thin film used for pattern formation, and a method of manufacturing a transfer mask. In addition, another object is to provide a method of manufacturing a semiconductor device using this transfer mask.

Means for Solving the Problems

In order to achieve the objects, the mask blank of the present invention is a mask blank provided with a thin film on a main surface of a glass substrate, wherein the glass substrate has a hydrogen content of less than $7.4 \times 10^{18}$ molecules/cm$^3$, the thin film is made of a material containing tantalum and being substantially free of hydrogen, and the thin film is formed in contact with the main surface of the glass substrate. The mask blank of the present invention makes it possible to inhibit worsening of flatness by eliminating the problem of film stress of the thin film demonstrating an increasingly strong tendency towards compressive stress over time.

In the mask blank, the hydrogen content of the glass substrate is preferably not less than $2.0 \times 10^{17}$ molecules/cm$^3$. In addition, the glass substrate is preferably composed of synthetic quartz glass. Moreover, it is more preferably a mask blank used to fabricate a transfer mask to which an ArF excimer laser is applied as exposure light. This is because, in the case the hydrogen content of the glass substrate is less than $2.0 \times 10^{17}$ molecules/cm$^3$, and particularly in the case of a synthetic quartz glass substrate, the problem occurs in which there is low fastness (light fastness) to exposure light of an excimer laser, and particularly an ArF excimer laser.

In each of the mask blanks, the thin film is preferably made of a material containing tantalum and nitrogen and being substantially free of hydrogen. As a result of containing nitrogen in tantalum, oxidation of the tantalum can be inhibited.

In this mask blank in particular, a highly oxidized layer containing not less than 60 at % of oxygen is preferably formed on the surface layer of the thin film. Since a highly oxidized coating of a thin film material has high binding energy, it is able to inhibit hydrogen in the air surrounding the mask blank from penetrating into the thin film from the surface layer of the thin film.

In each of the mask blanks, the thin film preferably has a structure in which a lower layer and an upper layer are laminated from the side of the glass substrate, the lower layer is preferably made of a material containing tantalum and nitrogen and being substantially free of hydrogen, and the upper layer is preferably made of a material containing tantalum and oxygen. As a result of employing this configuration, the upper layer is able to function as a film having a function that controls surface reflectance of the thin film with respect to exposure light (antireflective film).

In this mask blank in particular, a highly oxidized layer containing not less than 60 at % of oxygen is preferably formed on the surface layer of the upper layer. Since a highly oxidized coating of a thin film material has high binding energy, penetration of hydrogen into the thin film from the surface layer of the thin film can be inhibited.

The transfer mask of the present invention is characterized by forming a transfer pattern in a thin film of each of the mask blanks. Since the flatness of the mask blank of the present invention is maintained at a required high level, a transfer mask manufactured using a mask blank having such characteristics is also able to have a required high flatness.

The method of manufacturing a semiconductor device of the present invention is characterized by exposing and transferring a transfer pattern to a resist film on a semiconductor substrate using the transfer mask. A semiconductor device having a highly precise pattern can be manufactured by exposing and transferring a transfer pattern to a resist film on a semiconductor substrate using the transfer mask of the present invention.

In the method of manufacturing a semiconductor device, the exposure and transfer preferably applies an ArF excimer laser as the exposure light. Transmittance of the glass substrate of this transfer mask is inhibited from decreasing even if this transfer mask is continuously irradiated with exposure light of an ArF excimer laser. Consequently, semiconductor devices having a highly precise pattern can be continuously manufactured.

On the other hand, in order to achieve the objects, the method of manufacturing a mask blank of the present invention is characterized by being provided with a step of preparing a glass substrate having a hydrogen content of less than $7.4 \times 10^{18}$ molecules/cm$^3$, and a step of placing the glass substrate in a deposition chamber, using a target containing tantalum, and introducing a hydrogen-free sputtering gas into the deposition chamber to form a thin film on the main surface of the glass substrate by a sputtering method. The method of manufacturing a mask blank of the present invention is able to inhibit worsening of flatness by eliminating the problem of film stress of a thin film demonstrating an increasingly strong tendency towards compressive stress over time.

In the method of manufacturing a mask blank, the hydrogen content of the glass substrate is preferably not less than $2.0 \times 10^{17}$ molecules/cm$^3$. In addition, the glass substrate is preferably composed of synthetic quartz glass. Moreover, the manufactured mask blank is more preferably a mask blank used to fabricate a transfer mask to which an ArF excimer laser is applied as exposure light. This is because, in the case the hydrogen content of the glass substrate is less than $2.0 \times 10^{17}$ molecules/cm$^3$, and particularly in the case of a synthetic quartz glass substrate, the problem occurs in which fastness (light fastness) is low to exposure light of an excimer laser, and particularly an ArF excimer laser.

In the method of manufacturing a mask blank, the step of forming the thin film preferably uses a sputtering gas containing nitrogen and being free of hydrogen. A thin film can be formed in which nitrogen is contained in tantalum and oxidation of the tantalum can be inhibited.

In the method of manufacturing a mask blank, the thin film preferably has a structure in which a lower layer and an upper layer are laminated from the side of the glass substrate, and the step of forming the thin film preferably comprises a step of introducing a sputtering gas containing nitrogen and being free of hydrogen into a deposition chamber and forming the lower layer on a main surface of the glass substrate by a sputtering method, and a step of introducing a sputtering gas containing oxygen and being free of hydrogen into a deposition chamber and forming the upper layer on the surface of the lower layer by a sputtering method. As a result of employing this composition, the upper layer is able to function as a film having a function that controls surface reflectance of the thin film with respect to exposure light (antireflective film).

The method of manufacturing a transfer mask of the present invention is characterized by forming a transfer pattern in a thin film of the mask blank using each of the mask blanks. Since flatness of the mask blank of the present invention is maintained at a required high level, a transfer mask manufactured using a mask blank having such characteristics is also able to have a required high flatness.

The method of manufacturing a semiconductor device of the present invention is characterized by exposing and transferring a transfer pattern to a resist film on a semiconductor substrate using a transfer mask manufactured with the method of manufacturing a transfer mask. A semiconductor device having a highly precise pattern can be manufactured by exposing and transferring a transfer pattern to a resist film on a semiconductor substrate using a transfer mask manufactured according to the method of manufacturing a transfer mask of the present invention.

In the method of manufacturing a semiconductor device, the exposure and transfer preferably applies an ArF excimer laser as the exposure light. Transmittance of the glass substrate of this transfer mask is inhibited from decreasing even if this transfer mask is continuously irradiated with exposure light of an ArF excimer laser. Consequently, semiconductor devices having a highly precise pattern can be continuously manufactured.

Effects of the Invention

According to the mask blank and method of manufacturing a mask blank of the present invention, film stress of a thin film does not demonstrate an increasingly strong tendency towards compressive stress over time even in a mask blank in which a material containing tantalum is used in a thin film for pattern formation. As a result, worsening of flatness of the mask blank over time can be inhibited after manufacturing the mask blank. In addition, since the mask blank of the present invention and a mask blank manufactured according to the method of manufacturing a mask blank of the present invention are able to inhibit film stress of a thin film for pattern formation from increasing over time, film stress of the thin film can be maintained at the level at the time of manufacturing. As a result, a large positional shift in a pattern, like that occurring in the case of having fabricated a transfer mask from a mask blank having a thin film of high film stress, can be inhibited. Moreover, in the case of having fabricated a transfer mask from the mask blank of the present invention or a mask blank manufactured with the method of manufacturing a mask blank of the present invention, a positional shift in a pattern can be inhibited from occurring over time following fabrication. Moreover, a transfer pattern can be transferred to a resist film on a semiconductor substrate using a transfer mask in which worsening of flatness of a main surface due to film stress of a thin film is inhibited and a positional shift in a pattern formed in the thin film is also inhibited. As a result, a semiconductor device can be manufactured that has a fine and highly precise circuit pattern on a semiconductor substrate.

BEST MODE FOR CARRYING OUT THE INVENTION

Figure 1:
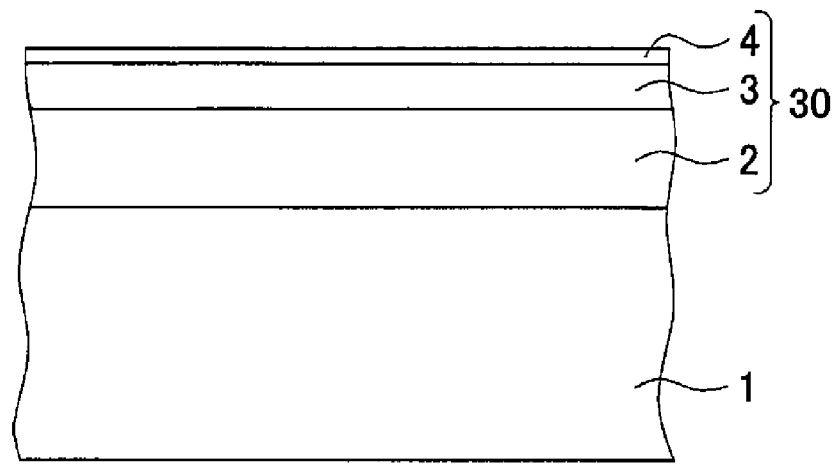
FIG. 1 is a cross-sectional view showing the composition of a mask blank according to an embodiment of the present invention.

The following provides an explanation of embodiments of the present invention.

The inventor of the present invention conducted extensive studies on the cause of compressive stress of a thin film containing tantalum deposited on a glass substrate increasing over time. First, various storage cases and storage methods were inspected in order to confirm whether the cause was the method in which the mask blank was stored after deposition. However, flatness of the main surface of the mask blank worsened in each case, and there was no well-defined correlation between the increase in compressive stress and the storage method. Next, heat treatment using a hot plate was carried out on a mask blank in which flatness of the main surface worsened in the direction of a convex shape. The conditions of heat treatment consisted of a temperature of 200° C. for about 5 minutes. When this heat treatment was carried out, the convex shape of the main surface temporarily changed in a somewhat preferable direction. However, as time elapsed following heat treatment, the flatness of the main surface of the mask blank again became worse, thus demonstrating that heat treatment does not offer a fundamental solution.

Next, the inventor of the present invention examined the possibility of a material containing tantalum having the quality of easily incorporating hydrogen being related to the cause of poor flatness. Namely, it was hypothesized that hydrogen is gradually incorporated in a thin film containing tantalum over time leading to an increase in compressive stress. However, a thin film containing tantalum of the mask blank in which this phenomenon of an increase in compressive strength over time occurred had a structure in which a lower layer made of a material containing tantalum and nitrogen and an upper layer formed on the lower layer and made of a material containing tantalum and oxygen were laminated on the side of the main surface of a substrate. The upper layer made of a material containing tantalum and oxygen had the effect of inhibiting penetration of hydrogen from the outside air. Consequently, it was thought it is difficult for hydrogen in the outside air to penetrate into a thin film containing tantalum.

The following verification was carried out in order to confirm whether or not hydrogen is incorporated in a thin film containing tantalum as time passes following completion of deposition. More specifically, film composition was analyzed for the following two types of mask blanks provided with a thin film made of a material containing tantalum. The first mask blank was a mask blank that was housed in a case for about two weeks after deposition so that not much time was allowed to elapse after deposition and flatness of the thin film did not worsen that much. The second mask blank was a mask blank that was housed in a case for four months after deposition so that compressive strength of the thin film increased and flatness worsened (to a degree that the amount of the variation of flatness was about 300 nm in terms of flatness based on TIR in a region inside a square measuring 142 mm on a side using the center of the substrate main surface as a reference). An HFS/RBS (hydrogen forward scattering/Rutherford back scattering) analysis was used to analyze film composition. As a result, in contrast to the thin film for which about two weeks had elapsed after deposition having hydrogen content below the detection limit, the thin film for which four months had elapsed after deposition was determined to have a hydrogen content of about 6 at %.

On the basis of these results, film stress was confirmed to change as a result of hydrogen penetrating into a thin film containing tantalum after deposition. Next, the inventor of the present invention suspected the glass substrate to be a hydrogen generation source. In the case of a transfer mask for which an excimer laser, and particularly an ArF excimer laser, is applied as the exposure light, Si—O—Si bonds within the glass material that composes the substrate are easily cleaved by being irradiated with high-energy excimer laser light. This cleavage becomes an absorbing region within the glass at a wavelength band of 215 nm. As a result, a phenomenon ends up occurring in which transmittance in the glass substrate of the transfer mask decreases with respect to ArF excimer laser light. Consequently, a glass substrate used in a transfer mask for which an excimer laser, and particularly an ArF excimer laser, is applied as the exposure light is typically made of a glass material in which the concentration of hydrogen molecules in the material has been enhanced.

When hydrogen content was measured by laser Raman scattering spectroscopy for a glass substrate made of the same glass material as that used in the mask blank provided with a thin film containing tantalum that underwent a change in film stress, the hydrogen content was determined to be $7.4 \times 10^{18}$ molecules/cm$^3$. In addition, mask blanks were respectively manufactured by using the same procedure to deposit a thin film containing tantalum on various glass substrates made of various glass materials having different hydrogen contents. The flatness of the surface of the thin film of each mask blank was respectively measured, and each mask blank was housed in a sealed case and stored for four months. Subsequently, each mask blank was removed from the case followed by respectively measuring the flatness of the thin film surface thereof. The correlation was then investigated between the amount of the variation of flatness of the thin film surface before and after each mask blank was stored in the case and the hydrogen content of each glass substrate. As a result, glass materials having a hydrogen content of at least less than $7.4 \times 10^{18}$ molecules/cm$^3$ were determined to be required to be applied to the glass substrates of the mask blanks.

The present invention was completed in consideration of the matters. Namely, the mask blank of the present invention is a mask blank provided with a thin film on a main surface of a glass substrate, wherein the glass substrate has a hydrogen content of less than $7.4 \times 10^{18}$ molecules/cm$^3$, the thin film is made of a material containing tantalum and being substantially free of hydrogen, and the thin film is formed in contact with the main surface of the glass substrate. In addition, the hydrogen content of the glass substrate is preferably not more than $4.0 \times 10^{18}$ molecules/cm$^3$, more preferably not more than $2.0 \times 10^{18}$ molecules/cm$^3$, and even more preferably not more than $8.0 \times 10^{17}$ molecules/cm$^3$.

On the other hand, in the case of a glass substrate of a transfer mask to which an ArF excimer laser is applied as the exposure light as was previously described, unless hydrogen is contained in the glass material, when the transfer mask is used (irradiated with exposure light of an ArF excimer laser), it is difficult to avoid the occurrence of a phenomenon in which transmittance of the glass substrate with respect to ArF excimer laser light decreases. As a result of investigating the relationship between hydrogen content of the glass substrate and fastness to irradiation with an ArF excimer laser, it was determined that it is necessary to apply a glass material having a hydrogen content of at least not less than $2.0 \times 10^{17}$ molecules/cm$^3$ to the glass substrate of the mask blank. Namely, a glass substrate in the mask blank of the present invention is characterized by having a hydrogen content of not less than $2.0 \times 10^{17}$ molecules/cm$^3$. In addition, the hydrogen content of the glass substrate is preferably not less than $3.0 \times 10^{17}$ molecules/cm$^3$ and more preferably not less than $5.0 \times 10^{17}$ molecules/cm$^3$.

When a glass substrate is subjected to irradiation with ArF excimer laser light, structural defects present within the glass material are excited facilitating the generation of E' centers and non-bridging oxygen hole centers (NBOHC). E'

(E prime) centers and NBOHC have the property of absorbing ArF excimer laser light. This is a factor behind the decrease in transmittance of the glass substrate. Hydrogen in a glass material has the function of repairing E' (E prime) centers and non-bridging oxygen hole centers (NBOHC). In the mask blank of the present invention, the hydrogen content of the glass substrate is reduced. When the hydrogen content in a glass material is reduced, the function of repairing E' (E prime) centers and NBOHC decreases. OH groups in a glass material function to inhibit structural defects within the glass material. Conversely, OH groups in a glass material cause accelerated induction of NBOHC as a result of being irradiated with ArF excimer laser light. On the basis thereof, the content of OH groups in a glass substrate used in the mask blank of the present invention is preferably not more than 600 ppm and more preferably not more than 500 ppm.

Examples of materials of the glass substrate of the mask blank include synthetic quartz glass as well as quartz glass, aluminosilicate glass, soda lime glass and low thermal expansion glass (such as $SiO_2$—$TiO_2$ glass). Since synthetic quartz glass in particular has high transmittance with respect to ArF excimer laser light (wavelength: 193 nm), synthetic quartz glass is preferably used for the material of the glass substrate.

There are no particular restrictions on the exposure light applied to the mask blank and transfer mask of the present invention, and examples thereof include ArF excimer laser light, KrF excimer laser light and i-line light. The required levels of main surface flatness and positional accuracy of transfer patterns formed in a thin film of mask blanks and transfer masks that apply an ArF excimer laser as the exposure light are extremely high. In addition, as was previously described, the glass substrates of transfer masks that apply an ArF excimer laser as the exposure light in particular, as well as mask blanks for fabricating those transfer masks, preferably have high fastness to ArF excimer lasers. Consequently, the present invention can be effectively applied to a mask blank or transfer mask that applies an ArF excimer laser as the exposure light.

The flatness of a glass substrate used in the mask blank and transfer mask of the present invention in a region inside a square measuring 142 mm on a side using the center of the substrate main surface as a reference (to be referred to as a region inside a 1.42 mm square) is preferably not more than 0.5 µm, and surface roughness in a region inside a square measuring 1 µm on a side is such that Rq (to be simply referred to as surface roughness Rq) is preferably not more than 0.2 nm. In addition, the flatness of a region inside a square measuring 132 mm on a side using the center of the substrate main surface as a reference (to be referred to as a region inside a 132 mm square) is more preferably not more than 0.3 µm. It is not possible to satisfy these conditions for flatness and surface roughness with a glass substrate in a state of having been cut out of a glass ingot. It is essential to carry out mirror polishing on at least a main surface of the glass substrate in order to satisfy conditions of high flatness and surface roughness. This mirror polishing is preferably carried out by double-sided polishing consisting of polishing both main surfaces of the glass substrate simultaneously using a polishing solution containing abrasive grains of colloidal silica. In addition, a main surface is preferably finished so as to satisfy the required conditions of flatness and surface roughness by carrying out a plurality of stages of grinding steps and polishing steps on a glass substrate in the state of having been cut out from a glass ingot. In this case, a polishing solution containing abrasive grains of colloidal silica is at least used in the final stage of the polishing steps.

Materials containing tantalum have the property of easily incorporating hydrogen. Since materials containing tantalum also have the property of becoming brittle following the incorporation of hydrogen, it is preferable to inhibit the content of hydrogen in a thin film even in the state immediately after having deposited a thin film. Consequently, in the present invention, a material containing tantalum and being substantially free of hydrogen is selected for the thin film formed on a main surface of a glass substrate. "Substantially free of hydrogen" refers to hydrogen content in the thin film of at least not more than 5 at %. The range of hydrogen content in the thin film is preferably not more than 3 at % and more preferably below the detection limit.

In addition, in the method of manufacturing a mask blank of the present invention, a step of preparing a glass substrate in which the hydrogen content is less than $7.4 \times 10^{18}$ molecules/$cm^3$, and a step of placing the glass substrate in a deposition chamber, using a target containing tantalum, and introducing a hydrogen-free sputtering gas into the deposition chamber to form a thin film on a main surface of the glass substrate by a sputtering method, are provided for the same reason.

Examples of a "material containing tantalum and being substantially free of hydrogen" that forms a film provided on the glass substrate include tantalum metal and materials being substantially free of hydrogen and containing one or more elements selected from nitrogen, oxygen, boron and carbon in addition to tantalum. Examples thereof include Ta, TaN, TaON, TaBN, TaBON, TaCN, TaCON, TaBCN and TaBOCN. The material may also contain metals other than tantalum within a range over which the effects of the present invention are obtained.

Furthermore, there are other metals that have the property of easily incorporating hydrogen in addition to tantalum, and effects similar to those of the present invention are obtained even in the case of substituting the tantalum in the material of the thin film with another metal having the property of easily incorporating hydrogen. Examples of other metals having the property of easily incorporating hydrogen include niobium, vanadium, titanium, magnesium, lanthanum, zirconium, scandium, yttrium, lithium and praseodymium. In addition, similar effects are also obtained for alloys made of tantalum and one or two or more metals selected from the group of metals having the property of easily incorporating hydrogen, as well as compounds of these alloys containing one or more types of elements selected from nitrogen, oxygen, boron and carbon.

The thin film of the mask blank is preferably made of a material containing tantalum and nitrogen and being substantially free of hydrogen. Tantalum is a material that is susceptible to natural oxidation. The light shielding performance (optical density) of tantalum to exposure light decreases as oxidation progresses. In addition, from the viewpoint of forming a thin film pattern, a material in a state in which oxidation of tantalum has not progressed can be said to be able to be dry-etched with any of an etching gas containing fluorine (fluorine-based etching gas) and an etching gas containing chlorine but not containing oxygen (oxygen-free, chlorine-based etching gas). However, from the viewpoint of forming a thin film pattern, tantalum in which oxidation has progressed is a material for which dry etching is difficult with an oxygen-free, chlorine-based etching gas, and can said to be a material that can only be etched with a fluorine-based etching gas. Oxidation of tantalum can be inhibited by containing nitrogen in the tantalum. In addition, in the case of forming a thin film made of a material containing tantalum in contact with a main surface of a glass substrate, a decrease in optical density can be inhibited in comparison with the case of containing oxygen while also reducing back side reflectance with respect to exposure light as a result of containing nitrogen in the tantalum, thereby making this preferable. The nitrogen content in the thin film from the viewpoint of optical density is preferably not more than 30 at %, more preferably not more than 25 at %, and even more preferably not more than 20 at %. In addition, in the case of back side reflectance being required to be less than 40%, the nitrogen content in the thin film is preferably not less than 7 at %.

In addition, a highly oxidized layer containing not less than 60 at % of oxygen is preferably formed on a surface layer (surface layer of a thin film on the opposite side from the substrate main surface) of the thin film of the mask blank. As was previously described, hydrogen not only enters the inside of a thin film from the substrate, but also enters the inside of a thin film from gas surrounding the mask blank. A highly oxidized coating of a thin film material has high binding energy and has the property of inhibiting penetration of hydrogen into the thin film. In addition, a highly oxidized layer of a material containing tantalum (tantalum highly oxidized layer) is provided with superior chemical resistance, hot water resistance and light fastness to ArF exposure light.

The thin film in a mask blank or transfer mask has a microcrystalline crystal structure and preferably a non-crystalline structure. Consequently, it is difficult for the crystal structure in the thin film to adopt a single structure and easily enters a state consisting of a mixture of a plurality of crystal structures. Namely, in the case of the tantalum highly oxidized layer, a state is easily adopted that consists of a mixture of TaO bonds, $Ta_2O_3$ bonds, $TaO_2$ bonds and $Ta_2O_5$ bonds. As the abundance ratio of $Ta_2O_5$ bonds increases in the surface layer of a thin film, the property of inhibiting penetration of hydrogen, chemical resistance, hot water resistance and ArF light fastness also increase. On the other hand, as the abundance ratio of TaO bonds increases in the surface layer of a thin film, these properties tend to decrease.

If the oxygen content in the tantalum highly oxidized layer is 60 at % to 66.7 at %, there is thought to be a greater tendency for the bonding state of tantalum and oxygen in the layer to consist mainly of $Ta_2O_3$ bonds. In the case of this oxygen content in the layer, it is thought that TaO bonds, which are the most unstable, are extremely few in comparison with the case of the oxygen content in the layer being less than 60 at %. If the oxygen content in the tantalum highly oxidized layer is not less than 66.7 at %, there is thought to be a greater tendency for the bonding state of tantalum and oxygen in the layer to consist mainly of $TaO_2$ bonds. In the case of this oxygen content in the layer, the most unstable TaO bonds and the next most unstable $Ta_2O_3$ bonds are both thought to be extremely few.

If the oxygen content in the tantalum highly oxidized layer is not less than 68 at %, it is thought that not only does the bonding state consist mainly of $TaO_2$ bonds, but that there is also an increase in the $Ta_2O_5$ bonding state. In the case of such oxygen content, the $Ta_2O_3$ and $TaO_2$ bonding states are of a degree such that they are only rarely present, while the TaO bonding state cannot be present at all. If the oxygen content of the tantalum highly oxidized layer is 71.4 at %, substantially only the $Ta_2O_5$ bonding state is thought to be formed. If the oxygen content of the tantalum highly oxidized layer is not less than 60 at %, not only the most stable $Ta_2O_5$ bonding state, but also the $Ta_2O_3$ and $TaO_2$ bonding states are thought to be contained. In addition, as a result of the oxygen content in the layer being not less than 60 at %, at least the most unstable TaO bonds are present in such an extremely low amount that they do not have an effect on the property of inhibiting penetration of hydrogen, chemical resistance or ArF light fastness. Thus, the lower limit of the oxygen content in the layer is thought to be 60 at %.

The abundance ratio of $Ta_2O_5$ bonds in the tantalum highly oxidized layer is preferably higher than the abundance ratio of $Ta_2O_5$ bonds in other parts of the thin film excluding the highly oxidized layer. $Ta_2O_5$ bonds constitute an extremely stable bonding state, and the property of inhibiting penetration of hydrogen, mask cleaning resistance in the form of chemical resistance or hot water resistance and the like, and ArF light fastness improve considerably as a result of increasing the abundance ratio of $Ta_2O_5$ bonds in the highly oxidized layer. In particular, it is most preferable that only the $Ta_2O_5$ bonding state be formed in the tantalum highly oxidized layer. Furthermore, the contents of nitrogen and other elements in the tantalum highly oxidized layer are preferably within a range that does not have an effect on actions and effects such as the property of inhibiting penetration of hydrogen, and are preferably substantially not contained.

The thickness of the tantalum highly oxidized layer is preferably 1.5 nm to 4 nm. If the thickness is less than 1.5 nm, the highly oxidized layer becomes excessively thin and cannot be expected to demonstrate the effect of inhibiting penetration of hydrogen, while if the thickness exceeds 4 nm, the effect on surface reflectance becomes excessively large, making it difficult to control the highly oxidized layer to obtain a predetermined surface reflectance (reflectance with respect to exposure light and reflectance spectra with respect to light of each wavelengths). In addition, since the tantalum highly oxidized layer has an extremely low optical density with respect to ArF exposure light, optical density able to be secured with a surface antireflective layer decreases and ends up acting negatively from the viewpoint of reducing film thickness of the thin film. Furthermore, in consideration of the balance between both the viewpoint of securing optical density of the entire thin film and the viewpoint of improving the property of inhibiting penetration of hydrogen, chemical resistance and ArF light fastness, the thickness of the highly oxidized layer is more preferably 1.5 nm to 3 nm.

The tantalum highly oxidized layer can be formed by carrying out hot water treatment, ozone-containing water treatment, heat treatment in a gas containing oxygen, ultraviolet irradiation treatment in a gas containing oxygen and/or $O_2$ plasma treatment on a mask blank following deposition of a thin film. Furthermore, the highly oxidized layer is not limited to a highly oxidized film of the metal that forms the thin film. The highly oxidized layer may be a highly oxidized film of any metal provided it has the property of inhibiting penetration of hydrogen, and a composition may be employed in which that highly oxidized film is laminated on the surface of the thin film. In addition, the highly oxidized layer is not required to consist of a highly oxidized material provided it is a material that has the property of inhibiting penetration of hydrogen, and a composition may be employed in which a film of that material is laminated on the surface of the thin film.

The thin film of the mask blank has a structure in which a lower layer and upper layer are laminated from the side of the glass substrate. The lower layer is preferably made of material containing tantalum and nitrogen and being substantially free of hydrogen, while the upper layer is preferably made of a material containing tantalum and oxygen. As a result of employing such a composition, the upper layer can be made to function as a film having a function that controls surface reflectance with respect to exposure light of the thin film (antireflective film).

Moreover, a highly oxidized layer containing not less than 60 at % of oxygen is preferably formed on the surface layer of the upper layer (surface layer on the opposite side from the lower layer). The highly oxidized layer along with aspects thereof, such as a highly oxidized layer of a material containing tantalum, as well as the actions and effects thereof, are the same as previously described. In consideration of ease of controlling surface reflectance properties (reflectance with respect to ArF exposure light and reflectance spectra with respect to light of each wavelengths), the oxygen content in the upper layer excluding the surface layer portion is preferably less than 60 at %.

The upper layer is made of a material containing oxygen in tantalum. From the viewpoint of forming a thin film pattern, dry etching of the upper layer (material containing oxygen in tantalum) is difficult with an oxygen-free, chlorine-based etching gas, and dry etching can only be carried out with a fluorine-based etching gas. In contrast, the lower layer is made of a material containing tantalum and nitrogen. From the viewpoint of forming a thin film pattern, dry etching of the lower layer (material containing tantalum and nitrogen) can be carried out with either a fluorine-based etching gas or oxygen-free, chlorine-based etching gas. Consequently, when using a resist pattern (resist film on which a transfer pattern has been formed) as a mask and forming a pattern by dry-etching the thin film, a process can be used in which a pattern is formed in the upper layer by carrying out dry etching with a fluorine-based etching gas, and a pattern is formed in the lower layer by carrying out dry-etching with an oxygen-free, chlorine-based etching gas using the pattern of the upper layer as a mask. The application of such an etching process makes it possible to reduce the thickness of the resist film.

The abundance ratio of tantalum and oxygen bonds having a comparatively high binding energy is preferably increased in the upper layer in order to make dry etching of the upper layer by oxygen-free, chlorine-based etching gas more difficult. The ratio of oxygen content (number of atoms) to tantalum content (number of atoms) of the upper layer is preferably not less than 1 in order to make dry etching of the upper layer more difficult. In the case the upper layer is formed only from tantalum and oxygen, the oxygen content in the upper layer is preferably not less than 50 at %.

The material that forms the lower layer of the thin film is the same as previously listed examples of materials containing tantalum and being substantially free of hydrogen. In addition, the material that forms the upper layer is preferably a material containing tantalum and oxygen and further containing carbon, boron, nitrogen and the like. Examples of materials that form the upper layer include TaO, TaON, TaBO, TaBON, TaCO, TaCON, TaBCO and TaBOCN.

The thin film of the mask blank is not limited to only the laminated structure. The structure may be a three-layer laminated structure, single-layer graded composition film, or a film structure having a composition gradient between the upper layer and lower layer. Although the thin film of the mask blank is preferably used as a light shielding film that functions as a light shielding pattern during fabrication of a transfer mask, it is not limited thereto. The thin film of the mask blank can also be applied as an etching stopper film or etching mask film (hard mask film), and can also be applied to a halftone phase shift film or light-semi-transmitting film provided it is within the range of the restrictions required for the thin film. In addition, since the mask blank is able to inhibit changes in thin film compressive stress over time, it is particularly preferable in the case of fabricating a transfer mask set to which double patterning technology (such as double patterning technology (DP technology) in the narrow sense or double exposure technology (DE technology)) that requires high positional accuracy for patterns formed in a thin film is applied.

In addition, in the method of manufacturing a mask blank of the present invention, the thin film has a structure in which a lower layer and an upper layer are laminated from the side of the glass substrate, and the step of forming the thin film is provided with a step of introducing a sputtering gas containing nitrogen and not containing hydrogen into a deposition chamber and forming the lower layer on a main surface of the glass substrate by a sputtering method, and a step of introducing a sputtering gas containing oxygen and not containing hydrogen into a deposition chamber and forming the upper layer on the surface of the lower layer by a sputtering method. The use of such a method of manufacturing a mask blank enables a thin film to be formed in which both the upper layer and the lower layer are substantially free of hydrogen.

The transfer mask of the present invention preferably has a transfer pattern formed in a thin film of the mask blank. In addition, a transfer mask manufactured according to the method of manufacturing a transfer mask of the present invention is preferably fabricated by using a mask blank manufactured according to the manufacturing method and forming a transfer pattern in a thin film of the mask blank. Since the mask blank of the present invention and a mask blank manufactured according to the method of manufacturing a mask blank of the present invention inhibit increases in compressive stress of a thin film over time, the flatness of the mask blank is maintained at a required high level. The use of a mask blank having such properties makes it possible to manufacture a transfer mask having a required high level of flatness. In addition, since compressive stress of the thin film is inhibited, the amount of positional shift on a main surface occurring in each pattern of a thin film, in which surrounding compressive stress has been released following an etching process used to fabricate the transfer mask, can be inhibited.

On the other hand, even a transfer mask manufactured according to a conventional manufacturing method (conventional transfer mask) demonstrates a required high level of flatness provided time has not elapsed following manufacturing. However, since flatness ends up worsening as a result of compressive stress of the thin film increasing in the case the conventional transfer mask is housed and stored in a mask case without using after manufacturing or in the case of having been used continuously after placing in an exposure apparatus, there is the risk of each pattern of the thin film undergoing a considerable positional shift. In the case of using a transfer mask fabricated using a mask blank of the present invention or a mask blank manufactured according to the manufacturing method of the present invention, since increases in compressive stress of the thin film over time can be inhibited, a required high level of flatness can be maintained and positional shifts of each pattern of the thin film can be inhibited even in the case of housing and storing it in a mask case without using after manufacturing or using continuously after placing in an exposure apparatus.

The transfer mask can be used as a binary mask, and is particularly preferable in the case ArF excimer laser light is applied as the exposure light in particular. In addition, the transfer mask can also be applied to an engraved Levenson phase shift mask, halftone phase shift mask, enhancer phase shift mask and chrome-less phase shift mask (CPL mask). In addition, since the transfer mask has superior pattern positional accuracy, it is particularly preferable in a transfer mask set to which double patterning technology (such as DP technology or DE technology) is applied.

Dry etching that is effective for forming a fine pattern is preferably used for the etching carried out on the mask blank when fabricating the transfer mask. A fluorine-based gas such as $SF_6$, $CF_4$, $C_2F_6$ or $CHF_3$ can be used for carrying out dry etching on a thin film with the etching gas containing fluorine. In addition, a chlorine-based gas such as $Cl_2$ or $CH_2Cl_2$ or a mixed gas of at least one of these chlorine-based gases and a gas such as He, $H_2$, $N_2$, Ar and/or $C_2H_4$ can be used for carrying out dry etching on a thin film with the etching gas containing chlorine and not containing oxygen.

A semiconductor device having a highly precise pattern can be manufactured by exposing and transferring a transfer pattern to a resist film on a semiconductor substrate using the transfer mask of the present invention or a transfer mask manufactured according to the manufacturing method of the present invention. This is because the transfer mask demonstrates a required high level of flatness and high pattern positional accuracy during fabrication. In addition, the transfer mask is able to continue to maintain a required high level of flatness and inhibit positional shifts of each pattern of the thin film even when placed in an exposure apparatus and initially used in exposure and transfer after having been housed and stored for a fixed amount in a mask case without using following fabrication, or when used in exposure and transfer by placing in an exposure apparatus immediately after mask fabrication.

As shown in FIG. 1, the mask blank according to the present embodiment has a lower layer (light shielding layer) 2, having a thickness of 42.5 nm and composed mainly of tantalum and nitrogen, formed on a glass substrate 1 composed of synthetic quartz, an upper layer (antireflective layer) 3, having a thickness of 5.5 nm and composed mainly of tantalum and oxygen, formed on the lower layer 2, and a tantalum highly oxidized layer 4 formed on the surface layer of the upper layer 3. Furthermore, a light shielding film 30 is composed with the lower layer 2 and the upper layer 3 containing the tantalum highly oxidized layer 4.

Figure 2:
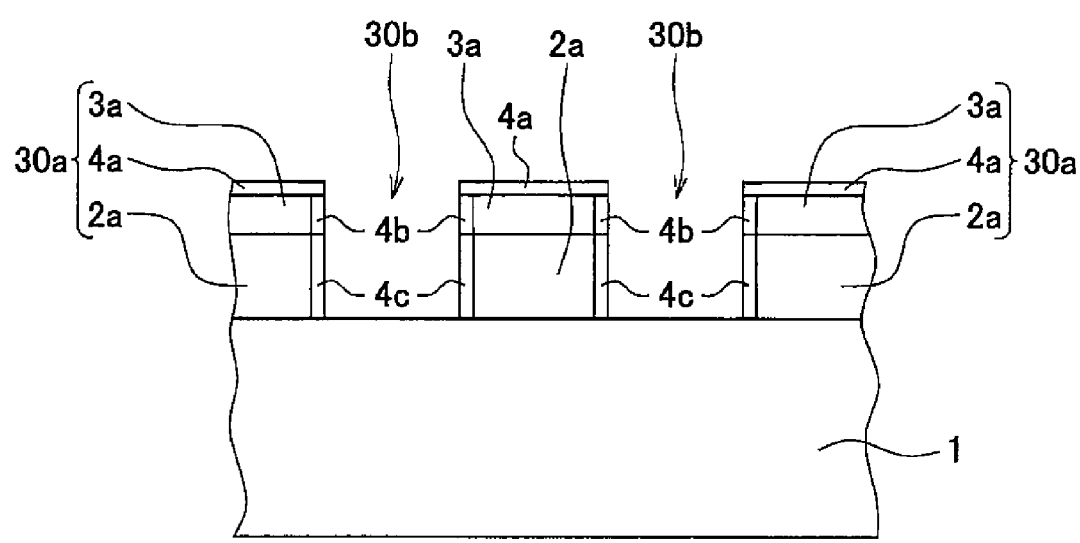
FIG. 2 is a cross-sectional view showing the composition of a transfer mask according to an embodiment of the present invention.

In addition, as shown in FIG. 2, the transfer mask according to the present embodiment has a fine pattern formed on the glass substrate 1, composed of light shielding portions 30a, obtained by allowing a portion of the light shielding film 30 to remain, and transparent portions 30b, obtained by removing the light shielding film 30, by patterning the light shielding film 30 of the mask blank shown in FIG. 1. A tantalum highly oxidized layer 4a is formed on the surface layer of the light shielding film pattern (thin film pattern) 30a. In addition, on the sidewalls of the light shielding film pattern 30a, a tantalum highly oxidized layer 4b is formed on the surface layer of the sidewalls of a pattern 3a of the upper layer 3, and a tantalum highly oxidized layer 4c is formed on the surface layer of the sidewalls of a pattern 2a of the lower layer 2. Furthermore, the method used to form the tantalum highly oxidized layers 4b and 4c on the sidewalls of each of the patterns 2a and 3a of the upper layer 2 and lower layer 3, respectively, is the same method as that used to form the tantalum highly oxidized layer in the mask blank.

EXAMPLES

Figure 3:
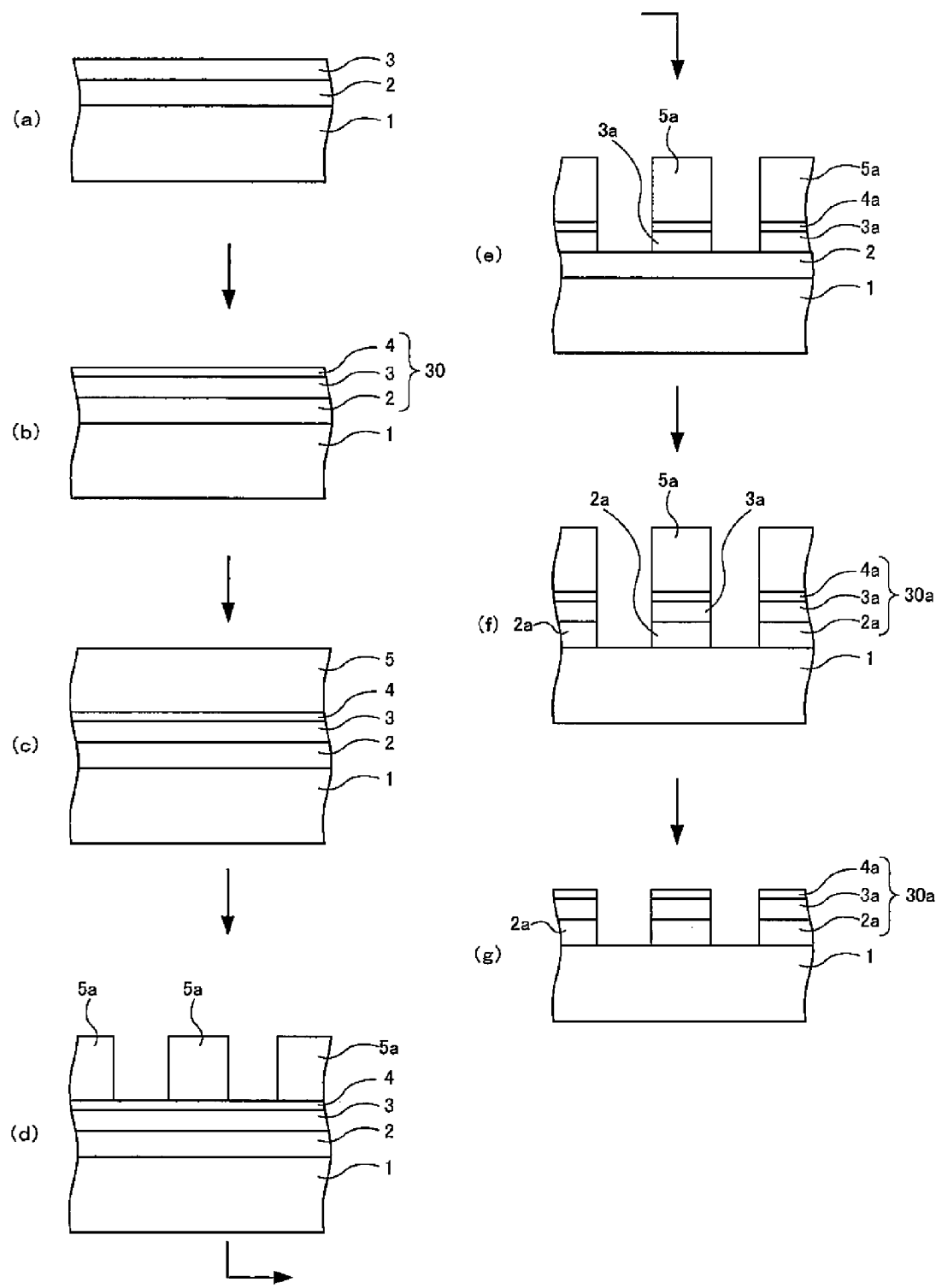
FIG. 3 is a cross-sectional view showing a process through manufacturing a transfer mask from a mask blank according to an embodiment of the present invention.

The following provides an explanation of examples of the present invention with reference to FIG. 3 by using as examples thereof the mask blank and transfer mask according to the present embodiment.

Example 1

[Manufacturing of Mask Blank]

A glass substrate was prepared composed of synthetic quartz glass having main surface dimensions of about 152 mm×about 152 mm and thickness of about 6.35 mm. The main surfaces of this glass substrate were polished to a predetermined flatness and surface roughness followed by subjecting to a predetermined cleaning treatment and drying treatment. Furthermore, the flatness of this glass substrate in a region inside a 142 mm square on the main surfaces thereof was not more than 0.3 μm and the surfaces had a convex shape. In addition, the surface roughness of the main surfaces was such that the root mean square roughness Rq in a measurement region within a square measuring 1 μm on a side was not more than 0.2 nm. This glass substrate was of an adequate level for use as a glass substrate used with a 22 nm node mask blank. Measurement of the hydrogen content of this glass substrate by laser Raman scattering spectroscopy yielded a value of $3.0 \times 10^{17}$ molecules/$cm^3$. The morphology of one of the main surfaces of this glass substrate was measured using a surface morphology analyzer (UltraFLAT 200M (Corning Tropel Corp.)). (The measurement region was a region inside a square measuring 148 mm on a side using the center of the glass substrate as a reference, and this is to apply similarly for all subsequent surface morphology measurement regions measured with a surface morphology analyzer.)

Next, the glass substrate was introduced into a DC magnetron sputtering apparatus following cleaning. A mixed gas of Xe and $N_2$ was introduced into the sputtering apparatus and a TaN layer (lower layer) 2 having a film thickness of 42.5 nm was deposited in contact with a main surface of the glass substrate 1 by a sputtering method using a tantalum target (see FIG. 3(*a*)). Moreover, the gas inside the sputtering apparatus was replaced with a mixed gas of Ar and $O_2$ and a TaO layer (upper layer) 3 having a film thickness of 5.5 nm was then deposited by the same sputtering method using a tantalum target (see FIG. 3(*a*)).

Next, this mask blank was placed on a hot plate and subjected to heat treatment at 300° C. in air to form the tantalum highly oxidized layer 4 on the surface layer of the TaO layer 3 (see FIG. 3(*b*)). The surface morphology of the light shielding film 30 on the substrate main surface was measured for the mask blank after having formed this highly oxidized layer 4 with the UltraFLAT 200M flatness measuring apparatus (Corning Tropel Corp.). In addition, as a result of carrying out HFSIRBS analyses on a mask blank manufactured under the same conditions, the hydrogen content in the TaN layer 2 was confirmed to be below the detection limit, and the highly oxidized layer 4 having a high oxygen content was confirmed to have been formed to a depth of 2 nm from the surface of the TaO layer 3. In addition, when X-ray photoelectron spectroscopy (XPS) analysis was carried out, a high peak was observed in a narrow spectrum of the uppermost layer of the light shielding film 30 at the location of the binding energy of $Ta_2O_5$ (2.54 eV). In addition, a peak was observed at the location of the binding energy of $Ta_2O_5$ (25.4 eV) in the narrow spectrum of a layer at a depth of 1 nm from the surface of the light shielding film 30. In addition, a peak was observed at a location between the binding energy of $Ta_2O_5$ (25.4 eV) and the binding energy of Ta (21.0 eV) that was closer to the location of the binding energy of $Ta_2O_5$. On the basis of these results, the highly oxidized layer 4 having $Ta_2O_5$ bonds can be said to have been formed on the surface layer of the TaO layer 3.

In addition, the reflectance on the film surface (surface reflectance) of the light shielding film 30 was 30.5% for ArF exposure light (wavelength: 193 nm). The reflectance on the surface of the glass substrate 1 on which the light shielding film was not formed (back side reflectance) was 38.8% for ArF exposure light. In addition, optical density for ArF exposure light was 3.02. In this manner, the mask blank of Example 1 was obtained that was provided with the light shielding film 30 having a laminated structure consisting of the TaN layer 2 and the TaO layer 3, containing the tantalum highly oxidized layer 4 in the surface layer thereof, on the main surface of the glass substrate 1.

Next, this mask blank of Example 1 was housed in a sealed state in a storage case and stored in a clean room until 150 days had passed. The mask blank of Example 1 subjected to this long-term storage was then removed and the surface morphology of the light shielding film 30 on the substrate main surface was measured with the UltraFLAT 200M flatness measuring apparatus (Corning Tropel Corp.). Next, the surface morphology (differential morphology), obtained by taking the difference between the surface morphology of the light shielding film 30 of the mask blank measured prior to long-term storage and the surface morphology of the light shielding film 30 of the mask blank after long-term storage, was calculated. When the differential value of flatness in a region inside a 142 mm square on the main surface was calculated from this differential morphology, the differential value was determined to be 23 nm (minute change in surface morphology in the convex direction attributable to long-term storage). Since this differential value of flatness was within the range of measurement error, there can be said to have been hardly any change observed in flatness before and after long-term storage.

Figure 4:
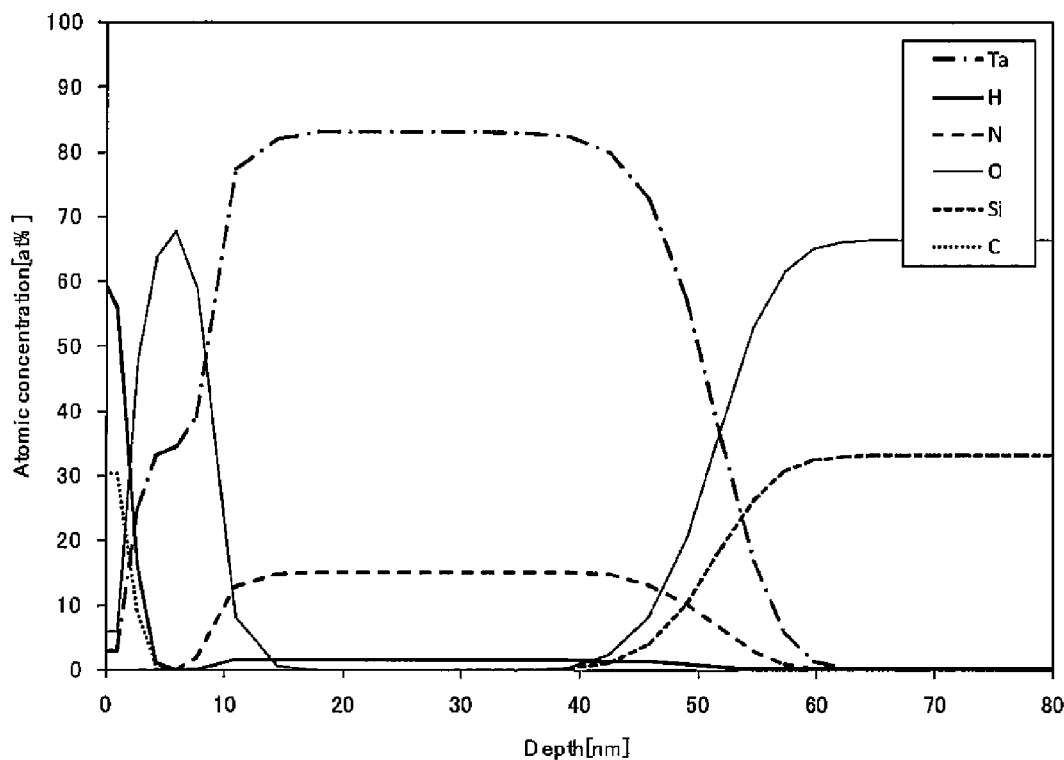
FIG. 4 is a graph showing the results of HFS/RBS analysis of a mask blank in an example.

In addition, the results of having carried out HFS/RBS analysis on a mask blank provided with this light shielding film 30 following long-term storage are shown in FIG. 4. In FIG. 4, depth (nm) from the surface of the light shielding film is plotted on the horizontal axis, while the composition of the light shielding film is plotted on the vertical axis as atomic concentration (at %). Based on the results of FIG. 4, hydrogen can be said to be contained at about 1.6 at % in the TaN layer. On the basis of this result, the supply source of hydrogen incorporated into the TaN layer can be said to be the glass substrate. In addition, based on the differential value of flatness before and after long-term storage, the incorporation of hydrogen into the TaN layer to the degree of about 1.6 at % was determined to have hardly any effect on flatness of the main surface.

[Fabrication of Transfer Mask]

The transfer mask of Example 1 was fabricated according to the procedure indicated below using the mask blank of Example 1 that had not been subjected to long-term storage.

First, a chemically amplified resist for electron beam drawing 5 having a film thickness of 100 nm was applied by spin coating (see FIG. 3(c)). After applying the resist 5, electron beam drawing and development were carried out on the resist 5 to form a resist pattern 5a (see FIG. 3(d)). Furthermore, a 22 nm node fine pattern was divided into two comparatively sparse transfer patterns using double patterning technology and one of those patterns was used for the pattern formed by electron beam drawing.

Next, dry etching was carried out using fluorine-based ($CF_4$) gas to fabricate a pattern 3a of the TaO layer (upper layer) 3 containing the highly oxidized layer 4 (see FIG. 3(e)). Continuing, dry etching was carried out using chlorine-based ($Cl_2$) gas to fabricate a pattern 2a of the TaN layer (lower layer) 2 and fabricate a light shielding film pattern 30a on the substrate 1 (see FIG. 3(f)). Continuing, the resist on the light shielding film pattern 30a was removed to obtain the light shielding film pattern 30a having the function of a transfer mask (see FIG. 3(g)). A transfer mask (binary mask) was obtained according to the above procedure.

Next, the fabricated transfer mask was immersed for 120 minutes in deionized (DI) water at 90° C. either prior to the progression of natural oxidation (such as within 1 hour after deposition) or after storing in an environment in which natural oxidation does not progress following deposition to carry out hot water treatment (surface treatment). The transfer mask of Example 1 was obtained as a result thereof.

In this transfer mask of Example 1, the formation of tantalum highly oxidized layers 4a, 4b and 4c was confirmed in the surface layer of the light shielding film pattern 30a as schematically shown in FIG. 2. More specifically, the highly oxidized layers 4a, 4b and 4c, having a thickness of 3 nm, were confirmed by cross-sectional observation with a scanning transmission electron microscope (STEM). In addition, HFS/RBS analysis was carried out on the portion of the light shielding film pattern 30a having a light shielding film. According to the analysis results of a profile in the direction of depth of the light shielding film, the tantalum highly oxidized layer 4a of the surface layer of the TaO layer 3 was confirmed to have an oxygen concentration of 71.4 at % to 67 at %. On the other hand, it was difficult to confirm oxygen content by HFS/RBS analysis for the sidewall portions of the pattern (4b and 4c). Consequently, energy dispersive X-ray spectroscopy (EDX) was used during STEM observation, a comparison was made with the results of the HFS/RBS analysis of the previously analyzed highly oxidized layer 4a of the surface layer of the light shielding film pattern 30a, and oxygen content was confirmed to be the same between the highly oxidized layer 4a and the highly oxidized layers 4b and 4c.

The fabricated transfer mask of Example 1 was housed in a sealed state in a mask case (storage case) and stored in a clean room until 150 days had elapsed. Pattern width and space width in a predetermined portion on the surface of the transfer mask were respectively measured before and after this long-term storage. The amounts of fluctuation in pattern width and space width before and after long-term storage were both within an allowed range. A transfer mask having one of the transfer patterns obtained by dividing a 22 nm node fine pattern into two comparatively sparse patterns using double patterning technology was fabricated using the mask blank of Example 1 according to the same procedure. According to the above procedure, a transfer mask set enabling transfer of a 22 nm node fine pattern to a transfer target was obtained by exposing and transferring using two transfer masks by double patterning technology.

[Manufacturing of Semiconductor Device]

A 22 nm node fine pattern was exposed and transferred to a resist film on a semiconductor device by using the transfer mask set following long-term storage, using an exposure apparatus using an ArF excimer laser as the exposure light, and applying double patterning technology. A predetermined development treatment was carried out on the resist film on the semiconductor device following exposure to form a resist pattern, and the lower layer film was dry-etched using this resist pattern as a mask to form a circuit pattern. Confirmation of the circuit pattern formed on the semiconductor device revealed the absence of wiring short-circuits and disconnections in the circuit pattern attributable to insufficient overlay accuracy.

Comparative Example 1

[Manufacturing of Mask Blank]

A glass substrate was prepared composed of synthetic quartz glass having main surface dimensions of about 152 mm×about 152 mm and thickness of about 6.35 mm. The main surfaces of this glass substrate were polished to a predetermined flatness and surface roughness followed by subjecting to a predetermined cleaning treatment and drying treatment. Furthermore, the flatness of this glass substrate in a region inside a 142 mm square on the main surfaces thereof was not more than 0.3 μm and the surfaces had a convex shape. In addition, the surface roughness of the main surfaces was such that the root mean square roughness Rq in a measurement region within a square measuring 1 μm on a side was not more than 0.2 nm. This glass substrate was of an adequate level for use as a glass substrate used with a 22 nm node mask blank. Measurement of the hydrogen content of this glass substrate by laser Raman scattering spectroscopy yielded a value of $7.4 \times 10^{18}$ molecules/cm$^3$. The morphology of one of the main surfaces of this transparent substrate was measured using a surface morphology analyzer (UltraFLAT 200M (Corning Tropel Corp.)) in the same manner as Example 1.

Next, the light shielding film 30 was deposited in contact with the surface of this glass substrate under the same deposition conditions as Example 1. Moreover, the glass substrate deposited with the light shielding film 30 was placed on a hot plate and heat treatment was carried out at 300° C. in air to form the tantalum highly oxidized layer 4 on the surface layer of the TaO layer 3. The surface morphology of the light shielding film 30 on the main surface of the substrate was measured for the mask blank having this highly oxidized layer 4 formed thereon with the UltraFLAT 200M flatness measuring apparatus (Corning Tropel Corp.). In this manner, the mask blank of Comparative Example 1 was obtained that was provided with the light shielding film having a laminated structure consisting of the TaN layer 2 and the TaO layer 3, which contained the tantalum highly oxidized layer 4 in the surface layer thereof, on the main surface of the glass substrate 1.

Next, this mask blank of Comparative Example 1 was housed in a sealed state in a storage case and stored in a clean room until 150 days had passed. The mask blank of Comparative Example 1 subjected to this long-term storage was then removed and the surface morphology of the light shielding film 30 on the substrate main surface was measured with the UltraFLAT 200M flatness measuring apparatus (Corning Tropel Corp.). Next, the surface morphology (differential morphology), obtained by taking the difference between the surface morphology of the light shielding film 30 of the mask blank measured prior to long-term storage and the surface morphology of the light shielding film 30 of the mask blank measured after long-term storage, was calculated. When the differential value of flatness in a region inside a 142 mm square on the main surface was calculated from this differential morphology, the differential value was determined to be 193 nm (indicating a considerable change in surface morphology in the convex direction attributable to long-term storage). This differential value of flatness was unacceptable in a mask blank at least for a 22 nm node.

Figure 5:
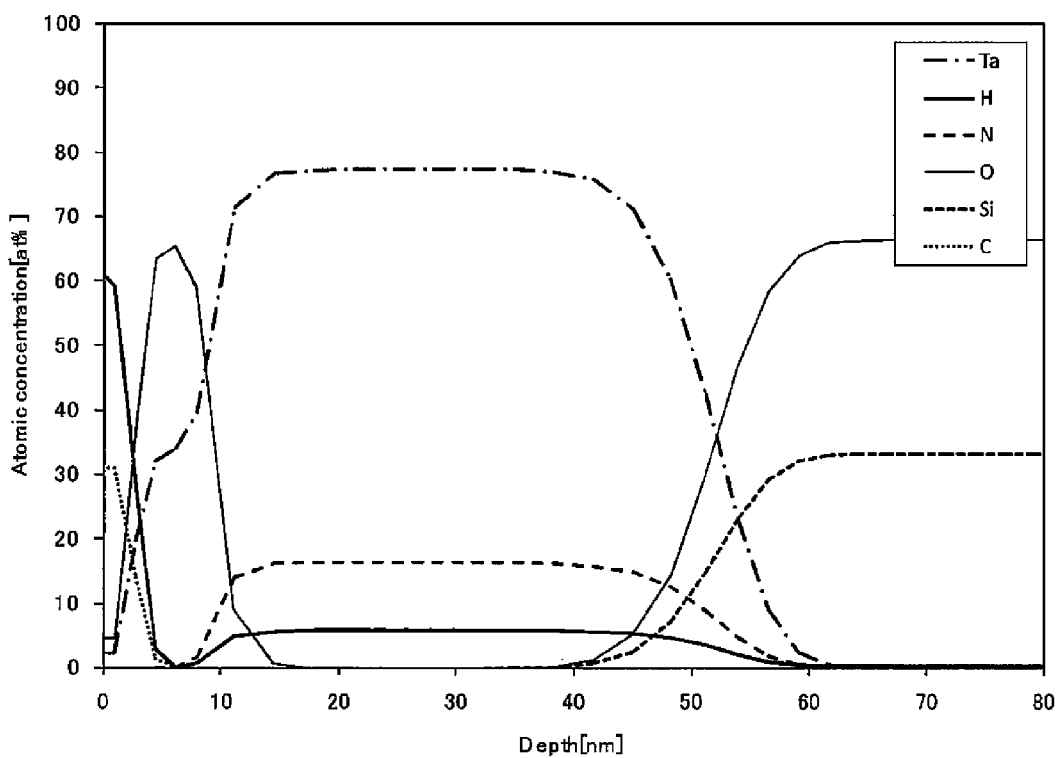
FIG. 5 is a graph showing the results of HFS/RBS analysis of a mask blank in a comparative example.

In addition, the results of having carried out HFS/RBS analysis on a mask blank provided with the light shielding film 30 following long-term storage are shown in FIG. 5. In FIG. 5, depth (nm) from the surface of the light shielding film is plotted on the horizontal axis, while the composition of the light shielding film is plotted on the vertical axis as atomic concentration (at %). In looking at the results of FIG. 5, hydrogen is contained at about 5.9 at % in the TaN layer. On the basis of this result, the supply source of hydrogen incorporated into the TaN layer can be said to be the glass substrate. In addition, based on the differential value of flatness before and after long-term storage, the incorporation of hydrogen into the TaN layer to the degree of about 5.9 at % was determined to considerably worsen flatness of the main surface.

[Fabrication of Transfer Mask]

Next, the transfer mask of Comparative Example 1 was fabricated according to the same procedure as Example 1 using the mask blank of Comparative Example 1 that had not been subjected to long-term storage. The fabricated transfer mask of Comparative Example 1 was housed in a sealed state in a mask case (storage case) and stored in a clean room until 150 days had elapsed. Pattern width and space width in a predetermined portion on the surface of the transfer mask were respectively measured before and after long-term storage. The amounts of fluctuation in pattern width and space width before and after long-term storage were both large, and were clearly outside the allowed range for a transfer mask in which double patterning technology is applied for at least a 22 nm node. Consequently, even if a transfer mask having one of the transfer patterns obtained by dividing a 22 nm node fine pattern into two comparatively sparse patterns using double patterning technology was fabricated according to the same procedure, overlay accuracy was low and the transfer mask was unable to be used as a transfer mask set for double patterning.

In addition, the transfer mask of Comparative Example 1 was attempted to be fabricated according to the same procedure as Example 1 using a mask blank obtained after the long-term storage. As a result, since the state of the mask blank was such that the flatness thereof had already worsened considerably, there was considerable movement of the pattern on the main surface when mask blank was clamped in the mask stage of the exposure apparatus, and it was clearly outside the allowed range for a transfer mask in which double patterning technology is applied for at least a 22 nm node. In addition, due to the remarkably large compressive stress of the light shielding film, the pattern of the light shielding film after dry etching demonstrated a considerable shift from the electron beam drawing pattern.

BRIEF DESCRIPTION OF THE REFERENCE SYMBOLS

1 Glass substrate
2 Lower layer (TaN layer)
2a Lower layer pattern
3 Upper layer (TaO layer)
3a Upper layer pattern
4,4a,4b,4c Tantalum highly oxidized layer
5 Resist film
30 Light shielding film
30a Light shielding portion
30b Transparent portion

The invention claimed is:

1. A mask blank provided with a thin film on a main surface of a glass substrate, wherein
the glass substrate has a hydrogen content of less than $7.4 \times 10^{18}$ molecules/cm$^3$,
the thin film is made of a material containing tantalum and being substantially free of hydrogen, and
the thin film is formed in contact with the main surface of the glass substrate.

2. The mask blank according to claim 1, wherein the hydrogen content of the glass substrate is not less than $2.0 \times 10^{17}$ molecules/cm$^3$.

3. The mask blank according to claim 1, wherein the glass substrate is composed of synthetic quartz glass.

4. The mask blank according to claim 1, wherein the mask blank is used to fabricate a transfer mask to which an ArF excimer laser is applied as exposure light.

5. The mask blank according to claim 1, wherein the thin film is made of a material containing tantalum and nitrogen and being substantially free of hydrogen.

6. The mask blank according to claim 1, wherein a highly oxidized layer containing not less than 60 at % of oxygen is formed on the surface layer of the thin film.

7. The mask blank according to claim 1, wherein the thin film has a structure in which a lower layer and an upper layer are laminated from the side of the glass substrate, the lower layer is made of a material containing tantalum and nitrogen and being substantially free of hydrogen, and the upper layer is made of a material containing tantalum and oxygen.

8. The mask blank according to claim 7, wherein a highly oxidized layer containing not less than 60 at % of oxygen is formed on the surface layer of the upper layer.

9. A transfer mask having a transfer pattern formed in a thin film of the mask blank according to claim 1.

10. A method of manufacturing a semiconductor device, comprising exposing and transferring a transfer pattern to a resist film on a semiconductor substrate using the transfer mask according to claim 9.

11. The method of manufacturing a semiconductor device according to claim 10, wherein the exposure and transfer applies an ArF excimer laser as the exposure light.

12. A method of manufacturing a mask blank, comprising:
a step of preparing a glass substrate having a hydrogen content of less than $7.4 \times 10^{18}$ molecules/cm$^3$, and
a step of placing the glass substrate in a deposition chamber, using a target containing tantalum, and introducing a hydrogen-free sputtering gas into the deposition chamber to form a thin film on the main surface of the glass substrate by a sputtering method.

13. The method of manufacturing a mask blank according to claim 12, wherein the hydrogen content of the glass substrate is not less than $2.0 \times 10^{17}$ molecules/cm$^3$.

14. The method of manufacturing a mask blank according to claim 12, wherein the glass substrate is composed of synthetic quartz glass.

15. The method of manufacturing a mask blank according to claim 12, wherein the mask blank is used to fabricate a transfer mask to which an ArF excimer laser is applied as exposure light.

16. The method of manufacturing a mask blank according to claim 12, wherein the step of forming the thin film uses a sputtering gas containing nitrogen and being free of hydrogen.

17. The method of manufacturing a mask blank according to claim 12, wherein
the thin film has a structure in which a lower layer and an upper layer are laminated from the side of the glass substrate, and
the step of forming the thin film comprises a step of introducing a sputtering gas containing nitrogen and being free of hydrogen into a deposition chamber and forming the lower layer on a main surface of the glass substrate by a sputtering method, and
a step of introducing a sputtering gas containing oxygen and being free of hydrogen into a deposition chamber and forming the upper layer on the surface of the lower layer by a sputtering method.

18. A method of manufacturing a transfer mask, comprising forming a transfer pattern in a thin film of a mask blank manufactured with the method of manufacturing a mask blank according to claim 12 using that mask blank.

19. A method of manufacturing a semiconductor device, comprising exposing and transferring a transfer pattern to a resist film on a semiconductor substrate using a transfer mask manufactured with the method of manufacturing a transfer mask according to claim 18.

20. The method of manufacturing a semiconductor device according to claim 19, wherein the exposure and transfer applies an ArF excimer laser as the exposure light.

* * * * *